US008344924B2

(12) United States Patent
Vigoda et al.

(10) Patent No.: US 8,344,924 B2
(45) Date of Patent: Jan. 1, 2013

(54) ANALOG SIGNAL CONVERSION

(75) Inventors: Benjamin Vigoda, Winchester, MA (US); Jeffrey Bernstein, Middleton, MA (US); Alexander Alexeyev, Gorham, ME (US); William Bradley, Somerville, MA (US); Theophane Weber, Boston, MA (US)

(73) Assignee: Analog Devices, Inc., Norwood, MA (US)

(*) Notice: Subject to any disclaimer, the term of this patent is extended or adjusted under 35 U.S.C. 154(b) by 98 days.

(21) Appl. No.: 13/095,188

(22) Filed: Apr. 27, 2011

(65) Prior Publication Data

US 2012/0194375 A1 Aug. 2, 2012

Related U.S. Application Data

(60) Provisional application No. 61/328,551, filed on Apr. 27, 2010.

(51) Int. Cl.
*H03M 1/12* (2006.01)

(52) U.S. Cl. ........................................ 341/155; 341/158

(58) Field of Classification Search .................. 341/155, 341/158
See application file for complete search history.

(56) References Cited

U.S. PATENT DOCUMENTS 6,542,105 B2 * 4/2003 Sakuragi ........................ 341/164
2010/0289681 A1 * 11/2010 Kamikisaki .................. 341/122

* cited by examiner

*Primary Examiner* — Khai M Nguyen
(74) *Attorney, Agent, or Firm* — Occhiuti Rohlicek & Tsao LLP

(57) ABSTRACT

An approach to converting an analog value based on a partition of an input range produces probabilities that the input is found within each of the regions based, for example, on a noisy version of the input. In some examples, iterative and/or pipelined application of comparison circuitry is used to accumulate a set of analog representations of the output probabilities. The circuitry can be adapted or configured according to the characteristics of the degradation (e.g., according to the variance of an additive noise) and/or prior information about the distribution of the clean input (e.g., a distribution over a discrete set of exemplar values, uniformly distributed etc.).

12 Claims, 16 Drawing Sheets

```
{Initialize:}
for all level, slice do
  DoSlice_(level,slice) = true
end for
RunningSum = 0
{Compute:}
for level = 1 to n do
  CurrentLevelSum = 0
  for slice = 1 to 2^(level-1) do
    if DoSlice_(level,slice) then
      Perform soft slicer to compte P(x > l_(level,slice)|y)
      if P(x > l_(level,slice)|y) < ε then
        for all branchLevel and branchSlice in the right-hand branch below slice do
          DoSlice_(branchLevel,branchSlice) = false
          P(x > l_(branchLevel,branchSlice)|y) = 0
        end for
      else if P(x > l_(level,slice)|y) > 1 − ε then
        for all branchLevel and branchSlice in the left-hand branch below slice do
          DoSlice_(branchLevel,branchSlice) = false
          P(x > l_(branchLevel,branchSlice)|y) = 1
        end for
      end if
    end if
    CurrentLevelSum = CurrentLevelSum + P(x > l_(level,slice)|y)
  end for
  {Bit Probabability:}
  ℙ(x ∈ B_level|y) = CurrentLevelSum − RunningSum
  RunningSum = RunningSum + CurrentLevelSum
end for
```

FIG. 7

{Initialize:}
for all $level, slice$ do
  $DoSlice_{(level,slice)} = true$
end for
$RunningSum = 0$
{Compute:}
for $level = 1$ to $n$ do
  $CurrentLevelSum = 0$
  for $slice = 1$ to $2^{level-1}$ do
    if $DoSlice_{(level,slice)}$ then
      Perform soft slicer to compte $P(x > l_{(level,slice)}|y)$
      if $y < yLowerThreshold_{(level,slice)}$ then
        for all $branchLevel$ and $branchSlice$ in the right-hand branch below $slice$ do
          $DoSlice_{(branchLevel,branchSlice)} = false$
          $P(x > l_{(branchLevel,branchSlice)}|y) = 0$
        end for
      else if $y > yUpperThreshold_{(level,slice)}$ then
        for all $branchLevel$ and $branchSlice$ in the left-hand branch below $slice$ do
          $DoSlice_{(branchLevel,branchSlice)} = false$
          $P(x > l_{(branchLevel,branchSlice)}|y) = 1$
        end for
      end if
    end if
    $CurrentLevelSum = CurrentLevelSum + P(x > l_{(level,slice)}|y)$
  end for
  {Bit Probabability:}
  $\mathbb{P}(x \in B_{level}|y) = CurrentLevelSum - RunningSum$
  $RunningSum = RunningSum + CurrentLevelSum$
end for

FIG. 8

```
{Initialize:}
for all level, slice do
  DoSlice_(level,slice) = true
end for
RunningSum = 0
{Compute:}
for level = 1 to n do
  CurrentLevelSum = 0
  for slice = 1 to 2^(level-1) do
    if DoSlice_(level,slice) then
      Perform soft slicer to compte P(x > l_(level,slice) | y)
      if y < yLowerThreshold_(level,slice) then
        for all branchLevel and branchSlice in the right-hand branch below slice do
          DoSlice_(branchLevel,branchSlice) = false
          P(x > l_(branchLevel,branchSlice) | y) = 0
        end for
      else if y > yUpperThreshold_(level,slice) then
        for all branchLevel and branchSlice in the left-hand branch below slice do
          DoSlice_(branchLevel,branchSlice) = false
          P(x > l_(branchLevel,branchSlice) | y) = 1
        end for
      end if
    end if
    CurrentLevelSum = CurrentLevelSum + P(x > l_(level,slice) | y)
  end for
  {Bit Probabability:}
  ℙ(x ∈ B_level | y) = CurrentLevelSum − RunningSum
  RunningSum = RunningSum + CurrentLevelSum
  if |ℙ(x ∈ B_level | y) − 1/2| < δ then
    for nextLevel = level + 1 to n do
      ℙ(x ∈ B_nextLevel | y) = 1/2
    end for
    Break
  end if
end for
```

FIG. 14

ANALOG SIGNAL CONVERSION

CROSS-REFERENCE TO RELATED APPLICATIONS

This application claims the benefit of U.S. Provisional Application No. 61/328,551 filed Apr. 27, 2010, the contents of which are incorporated herein by reference.

This application is related to, but does not claim the benefit of the filing date of the following applications: U.S. application Ser. No. 12/716,113, titled "SIGNAL MAPPING," filed Mar. 2, 2010; and U.S. application Ser. No. 12/716,155, titled "ANALOG COMPUTATION USING NUMERICAL REPRESENTATIONS WITH UNCERTAINTY," filed on Mar. 2, 2010. The contents of these applications are incorporated herein by reference.

STATEMENT AS TO FEDERALLY SPONSORED RESEARCH

This invention was made with government support under FA8750-07-C-0231 awarded by the Defense Advanced Research Projects Agency (DARPA). The government may have certain rights in this invention.

BACKGROUND

This disclosure relates to processing of noisy signals, and more particularly, to conversion of noisy signals to a probabilistic representation.

One approach to conversion of an analog value to a digital value based on a partition of the input range makes use of an analog-to-digital (A/D) converter (ADC). An input range with $2^n$ input regions can output an n-bit digital value representing which region the input is found within. Among the fastest A/D converters are "flash" converters. A flash (or direct) converter can make use of 2n−1 comparators to perform an n-bit conversion in one stage, which each comparator being associated with a region quantized to the same digital value. The size and cost of all those comparators makes flash converters generally impractical for large numbers of output bits (e.g., much greater than eight bits or 255 comparators). Other forms of A/D converters use multiple iterations to reduce the circuitry at the expense of increased conversion time. For example, a successive approximation ADC can use $\log_2(n)$ processing stages with a single comparator.

SUMMARY

Another approach to converting an analog value based on a partition of an input range is one that outputs probabilities that the input is found within each of the regions based, for example, on a noisy version of the input. An approach based on use of a parallel arrangement of circuitry that maps the noisy input into a set of analog representations of probabilities is described in co-pending application publication US2010/0281089A1, "SIGNAL MAPPING," published on Nov. 4, 2010. Such circuitry can be adapted or configured according to the characteristics of the degradation (e.g., according to the variance of an additive noise) and/or prior information about the distribution of the clean input (e.g., a distribution over a discrete set of exemplar values, uniformly distributed etc.).

In a general aspect, another approach to converting an analog value into a set of probabilities avoids use a fully parallel arrangement of circuitry as described in US2010/0281089A1. In some examples, an iterative approach is used to determine the output probability values in a series of iterations. For instance, each iteration is associated with a different bit of an n-bit representation of $2^n$ regions of the input range, and output probability and/or intermediate values can be accumulated, for example, in analog form, during the iterations.

In another aspect, in general, a signal converter includes an input comparison module configured to accept an analog signal input, and to provide an analog comparison output characterizing a continuous value and a logical comparison output. A controller is coupled to the input comparison module and is configured to accept the logical comparison output from the input comparison module, and to control configuration of the input comparison module according to the logical comparison output. An analog accumulator is used for accumulating the analog comparison output from the input comparison module, and providing a plurality of analog values, each analog value being associated with a different domain of the input of the input comparison module.

Aspects may include one or more of the following features.

The analog accumulator includes a plurality of storage elements, each storage element being associated with a different one of the analog values provided.

The controller is configured to control an iterative conversion of the analog signal input, wherein at each iteration, the analog accumulator is updated with an analog comparison output.

The controller is configured to control a data dependent conversion, including terminating the conversion after a number of iterations that depends on the analog signal input.

The converter has plurality of pipeline stages, wherein each of the stages includes an analog accumulator, an input comparator, and an analog input memory element, the analog accumulators being coupled to pass analog values between stages of the pipeline.

The controller is configured to control a pipelined conversion of a series of analog signal inputs, including configuring an input comparison at each stage according to a logic output of an input comparison at a prior stage.

A computing device is coupled the analog accumulator and configured to perform a probabilistic computation using the analog values provided from the accumulator.

In another aspect, in general, a method is used for converting a noisy analog signal, which corresponds to a first signal, into a plurality of analog values, each of which characterizes a probability that the first signal is in a corresponding part of its range. In some examples, the input range is partitioned into $2^n$ parts, each of which is associated with an n-bit index, for example a base 2 (binary) number of a Gray Code index. In these examples, each of the analog values characterizes a probability that a corresponding different one of the n bits of the index will take on a particular value. The method includes receiving the noisy signal that includes the first signal in combination with noise, identifying a set of values that correspond to a first state of the bit; determining a probability that the noisy signal, in the absence of noise, would have had a value within the set of values; comparing the probability with a probability threshold; and for at most one of the plurality of bits, based on at least the comparison, terminating the procedure.

In some examples, for at least one of the bits, the set of values includes a plurality of non-overlapping subsets, each of which has a lower boundary and an upper boundary. In such practices, determining the probability includes for each of the lower boundaries, determining a first probability, the first probability being a probability that the noisy signal, in the absence of the noise, would have had a value in excess of the lower boundary, for each of the upper boundaries, determining a second probability, the second probability being a probability that the noisy signal, in the absence of the noise, would have had a value in excess of the upper boundary, and determining a difference between a sum of each of the first probabilities and a sum of each of the second probabilities.

In another aspect, a method is directed to representing an estimate of a value of a noisy analog signal with a plurality of bits. Such a method includes receiving a noisy signal that includes a transmitted signal in combination with noise; identifying a set of values that correspond to a state of the bit; identify non-overlapping subsets of the set of values, each of the non-overlapping subsets having a boundary; for one of the boundaries, determining a probability that a noisy signal, in the absence of noise, would have had a value in excess of the boundary; determining that the value is at least a threshold distance from a value indicative of certainty; on the basis of the boundary, selecting a set of additional boundaries; and for each of the boundaries in the selected set, setting the boundary to a value that indicates certainty.

In yet another aspect, a method is directed to representing an estimate of a value of a noisy analog signal with a plurality of bits, said method comprising: receiving a noisy signal that includes a transmitted signal in combination with noise; determining a probability that said noisy signal, in the absence of noise, would have had a value within a range of values; on the basis of said determined probability, making an inference concerning a most likely value of a bit probability for a second bit in said plurality of bits, wherein said second bit is less significant than said first bit; on the basis of said inference, assigning a bit probability to said second bit.

Other aspects of the invention include a manufacture that includes a computer-readable medium having encoded thereon software for implementing the foregoing methods, as well as an, apparatus that includes an analog-to-probability converter with circuitry configured to implement any of the foregoing methods.

In some examples, a set of one or more soft slicers are combined with a decision tree to create an analog-to-probability converter. The output from the set of soft slicers is used to decide the probability associated with each successively less significant bit. This can be used as a basis for deciding what branches of the decision tree should be traversed for the next bit. For those bits that are deep within the noise, the information within those bits is essentially obscured by the noise. As a result, the probabilities that those bits take on a particular value are simply set to 0.5, without having to actually calculate them.

In other cases, where the a noiseless version of a received signal has a slice probability at a particular bit that is close to zero or one, the apparatus sets the slice probability to either one or zero, as appropriate, for all corresponding slice probabilities for less significant bits that lie on one or the other branch of a decision tree below the corresponding slice of that bit. Again, this avoids the need to actually calculate those probabilities.

A number of advantages accrue to an apparatus as described herein. For example, analog or stochastic circuits for assigning probabilities can use less energy than digital slicers in a conventional A/D converter. As a result, the apparatus described herein can save energy.

The apparatus described herein also avoids having to compute output bits that contain little or no information. This saves time and energy.

The apparatus described herein is capable of outputting "soft information" in stochastic or analog format, which is ideal for input into an analog or stochastic probability computer.

The soft slicer compares a value of the input noisy signal with a boundary value, or slicer level, and outputs a probability that the input value would have been classified, in the absence of noise, as having a value greater than or equal to the slicer level. This probability is then provided to a window comparator, which determines if the probability is within one of two windows, each of which is bounded by a value indicating certainty (0 or 1), and each of which has a pre-selected width.

Aspects may have one or more of the following advantages. "Soft Slicers" (e.g., analog or stochastic demappers) may use less power than digital slicers in a conventional ADC, thereby saving energy in conversion of an analog input.

A controller of the signal conversion can avoid computing or outputting bits that contain little or no information thereby saving time and energy. For example, in a case in which successively less significant bits are effectively unknown due to the input noise level and/or the proximity of the input to boundaries corresponding to the bit values, the conversion can be terminated. Note that such termination may depend on the input value, and not solely on the signal to noise level.

Pipelined implementations of the signal converter can use approximately exponentially fewer demapper slicers at the cost of approximately linearly more latency through the circuit.

The system is capable of outputting "soft information" in stochastic or analog format, which is ideal for input into an analog or stochastic probability computer.

By computing the soft information using a soft slicer and directly outputting it, we eliminate some number of stages from the pipeline process. Additional, stages are undesirable because they allow additional opportunities for noise, mismatch, nonlinearities, or other non-idealities to enter into the conversion process.

Other features and advantages of the invention are apparent from the following description, and from the claims.

DESCRIPTION OF DRAWINGS

FIGS. 7 and 8 are pseudocode corresponding for FIGS. 3 and 5, respectively;

FIG. 14 is pseudocode corresponding to FIG. 4

DESCRIPTION

Figure 1:
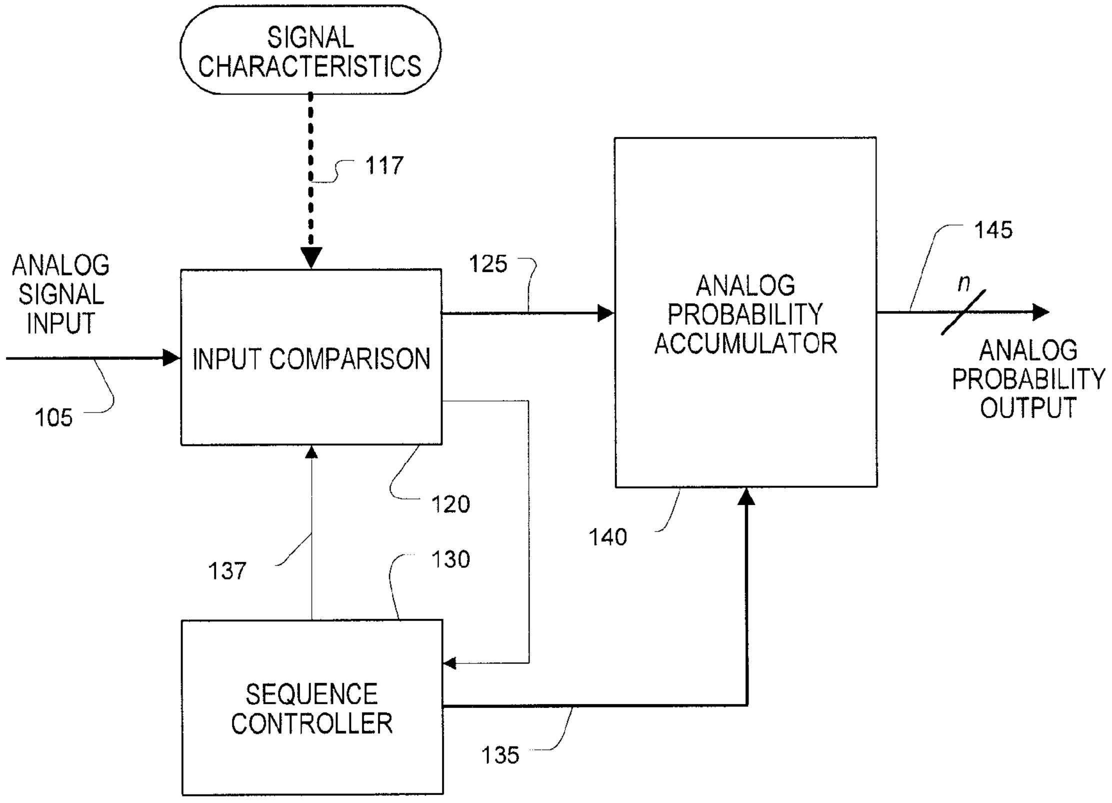
FIG. 1 is a block diagram of a signal conversion system.

Referring to FIG. 1, a number of embodiments of a signal conversion system 100 accept an analog signal input 105, which in general has been corrupted, for instance, by an additive noise, and produce as output n analog signals, each signal representing a probability that the original signal prior to being corrupted belonged to a particular class. Although the classes may be disjoint in that the original signal belonged to exactly one of the classes, more generally, the classes are overlapping.

One example of overlapping classes corresponds to a bit position in a binary number. For example, suppose that the original range of the signal, x was $0.0 \leqq x < 8.0$, one choice is to define 8 classes, indexed from 0 to 7, such that class $0=000_2$ (the subscript indicating base 2) is associated the range $0.0 \leqq x < 1.0$, through class $7=111_2$ being associated with the range $7.0 \leqq x < 8.0$. In such an example, n=3 analog probability outputs 145 may be provided, with each providing a probability that a corresponding one of the three bits is 1. This type of representation may be used in further probabilistic computation, for example, using the techniques described in co-pending application "ANALOG COMPUTATION USING NUMERICAL REPRESENTATIONS WITH UNCERTAINTY", published as US2010/0223225A1 on Sep. 2, 2010. Note that other than the most significant bit corresponds to a union of multiple ranges. For example, the second bit corresponds to the original signal range $2.0 \leqq x < 4.0 \cup 6.0 \leqq x < 8.0$.

In a situation in which the analog input is not degraded by noise, and the classes correspond to the bits of a binary index number of contiguous analog ranges, the output probabilities are either 0.0 or 1.0, and the signal conversion system effectively acts as a conventional Analog-to-Digital Converter (ADC). In the corresponding situation in which the input is degraded by a noise (e.g., an additive noise), the outputs represent the probabilities $\mathbb{P}(x \in \mathcal{B}_k | y)$ for all k, where $\mathcal{B}_k$ is the set of all (noise-free) values at the input of an ADC that would produce a 1 in the $k^{th}$ bit.

For binary encoding from bit-values, most of the sets $\mathcal{B}_k$ contain multiple non-overlapping regions. We can decompose the problem of finding probabilities of bits into a problem of finding cumulative probabilities associated with the boundaries of each region, and then determining the bit probabilities from these. For one-dimensional signals, each region, i, can be identified by its lower and upper boundaries, $l_{k,i}$ and $u_{k,i}$, respectively. (The top-most region for all bits has an upper bound of $+\infty$, since $x \to +\infty$ would map to the all-ones ADC output.)

Figure 3:
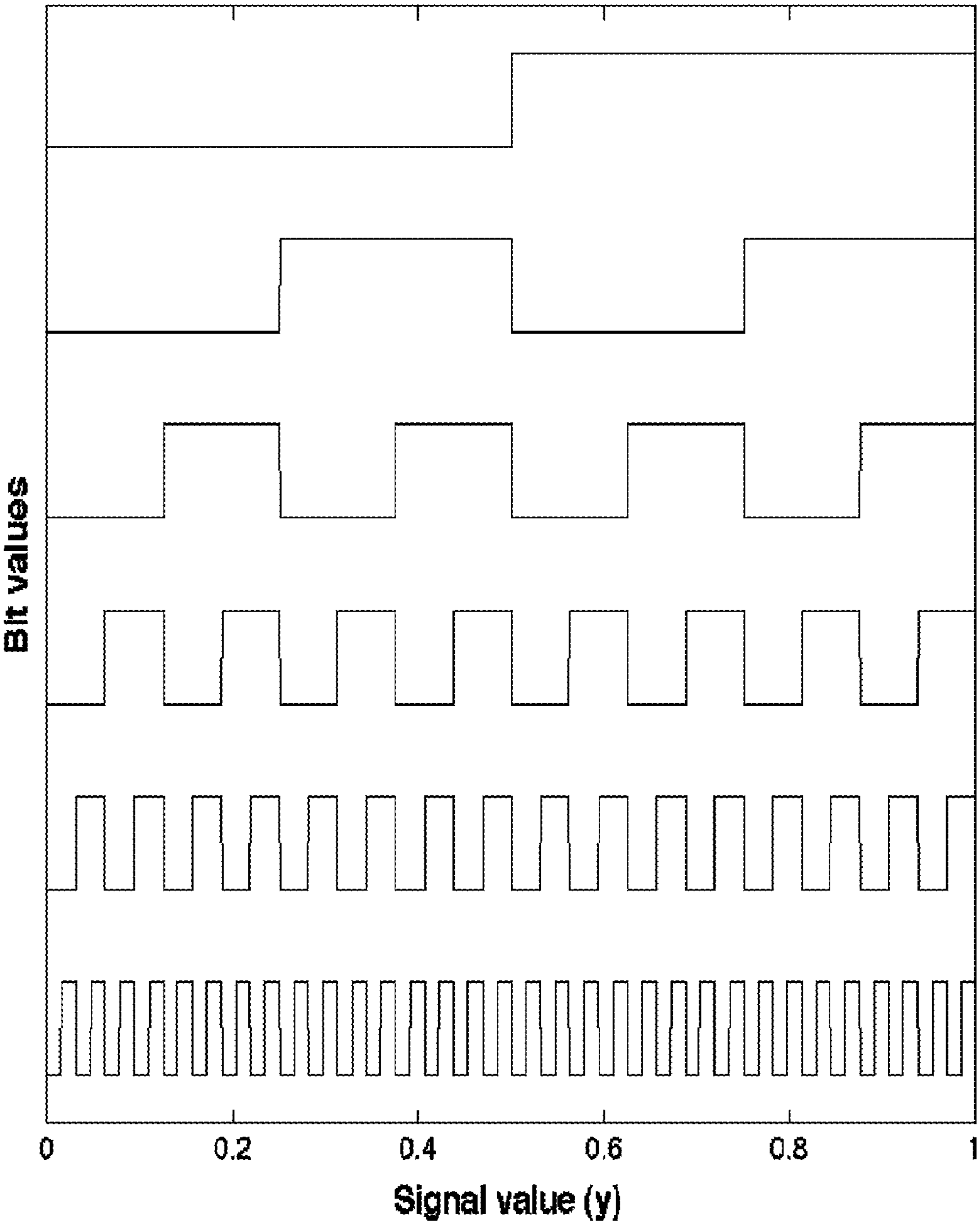
FIG. 3 is a diagram illustrating signal regions associated with different bits of a multiple bit representation.

FIG. 3 shows the region boundaries for an example 6-bit ADC. For each bit (with the most-significant-bit at the top), the regions $\mathcal{B}_k$ correspond to the ranges of signal values for which the bit is high.

For each boundary (upper or lower), $d_i$, we wish to determine the probability that the input, x is greater than or equal to this value (this is one minus the cumulative distribution of x given y evaluated at $d_i$). We can write this in terms of the probability density function, $p_{x|y}(x|y)$, as:

$$\mathbb{P}(x \geq d_i | y) = \int_{d_i}^{\infty} p_{x|y}(x | y)\, dx \tag{1}$$

$$= \int_{d_i}^{\infty} \frac{p_{xy}(x, y)}{p_y(y)}\, dx \tag{2}$$

$$= \frac{\int_{d_i}^{\infty} p_{xy}(x, y)\, dx}{\int_{-\infty}^{\infty} p_{xy}(x, y)\, dx} \tag{3}$$

$$= \frac{\int_{d_i}^{\infty} p_x(x) p_{y|x}(y | x)\, dx}{\int_{-\infty}^{\infty} p_x(x) p_{y|x}(y | x)\, dx} \tag{4}$$

The denominator is a normalization constant and is independent of i. We refer to the function associated with each boundary, $d_i$, as a "soft slicer."

The term $p_{y|x}(y|x)$ represents the noise through the distribution of y given a known value of x. For independent, identically distributed (i.i.d.) additive noise (where y=x+n), $p_{y|x}(y|x)=p_n(y-x)$. For i.i.d. additive Gaussian noise, $p_{y|x}(y|x)=\mathcal{N}_y(x,\sigma_n)$.

The term $p_x(x)$ represents the prior distribution of the signal—that is, the distribution of the signal prior to the knowledge gained by measuring the value y. In case the actual signal distribution is known, this distribution should be used in the calculation. If, for example, our knowledge of x were limited to its mean, $\mu_x$ and average energy, $\sigma_x^2$, we could use $p_x(x)=\mathcal{N}_x(\mu_x,\sigma_x)$. If, instead, we knew that the signal was bounded by a certain lower and upper bound, L and U, respectively, we could use $$p_x(x) = \begin{cases} \frac{1}{U-L} & \text{if } L \leq x \leq U \\ 0 & \text{otherwise.} \end{cases}$$

Given the set of boundary probabilities, we can compute the bit probabilities by summation:

$$\mathbb{P}(x \in \mathcal{B}_k | y) = \sum_i \mathbb{P}(x \geq l_{k,i} | y) - \sum_j \mathbb{P}(x \geq u_{k,j} | y) \tag{5}$$

where, for each k, the values of i index the set of all lower boundaries of the regions of $\mathcal{B}_k$ and the values of j index the set of all upper boundaries of the regions of $\mathcal{B}_k$.

Continuing to refer to FIG. 1, the signal conversion system 100 includes an input comparison module 120, which is operated in a series of iterations under the control of a sequence controller 130. The comparison module 120 receives the analog input signal and produces both analog and digital outputs. Generally, the comparison module 120 provides one or more analog signals, which are accumulated in an analog probability accumulator 140 (for clarity, analog signal paths are represented in bold lines). The accumulator includes an analog storage element corresponding to each of the n outputs 145. The value one or more storage elements is updated at each iteration based on the analog outputs of the comparison module. The comparison module also provides digital (i.e., logic) signals to the sequence controller 130. At each iteration, the sequence controller configures the input comparison module 120, as well as the analog probability accumulator 140, so that the appropriate comparisons are made, and that the analog results of the comparisons update the appropriate memory elements in the accumulator.

Figure 2:
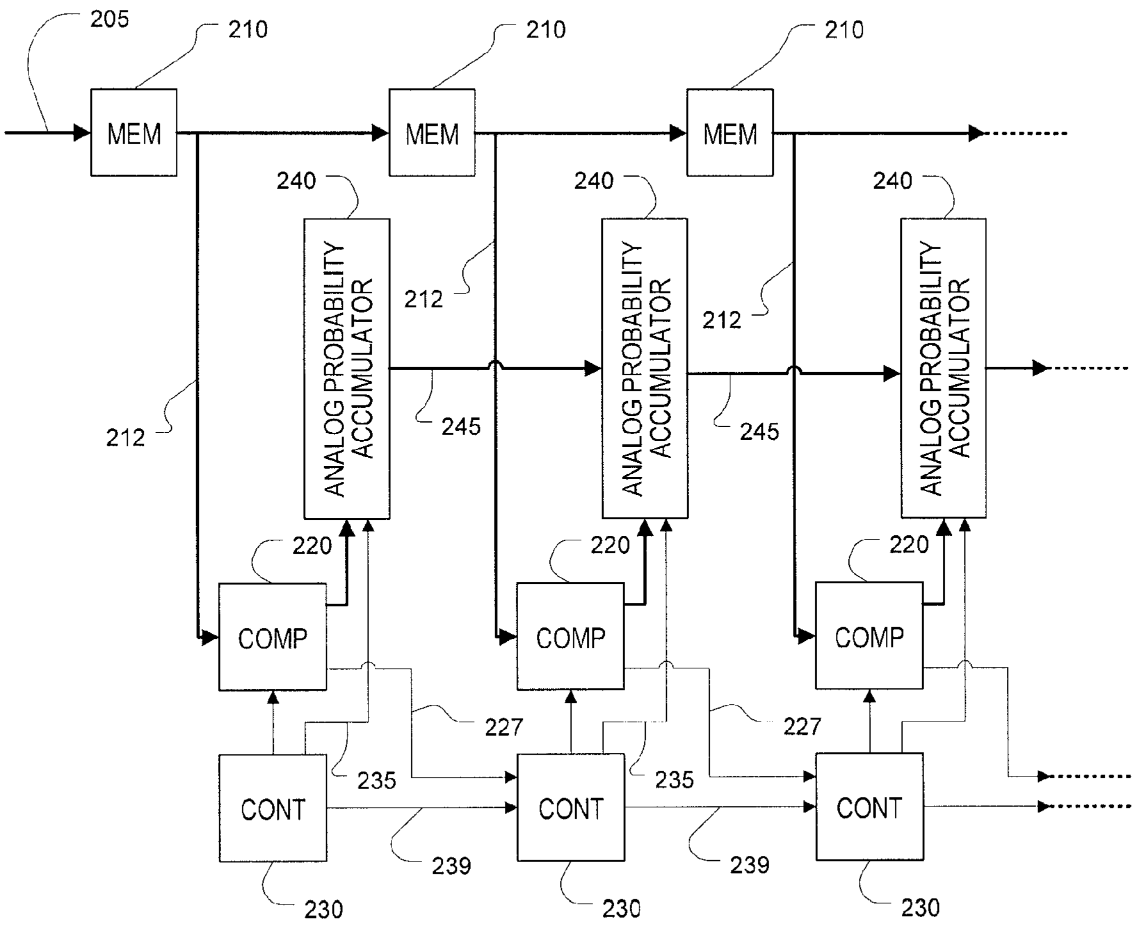
FIG. 2 is a block diagram of a pipelined signal conversion system.

Referring to FIG. 2, a pipelined conversion system 200 can be used to implement effectively the same iterations as with the system 100 shown in FIG. 1, with a difference being that each iteration is performed in a successive stage of the pipeline. Each analog input 205 passes through a series of analog memories 210, with the first memory 210 functioning as a sample-and-hold circuit, and the memories 210 effective forming an analog shift register. A series of analog probability accumulators 240 pass partially determined analog values through the stages of the pipeline, with the value at each stage being determined by the output of a comparison module ("COMP") 220 at each stage. Control logic ("CONT") 230 is associated with each stage for configuring the comparison module and the analog accumulator for that stage.

The functions implemented by the modules are introduced below in general terms, with further specific embodiments being described after this introduction.

In the common case of Gaussian noise, where $p_{y|x}(y|x)=\mathcal{N}_y(x,\sigma_n)$, the computation of $\mathbb{P}(x\geqq d_i|y)$ can simplify.

If nothing is assumed about the prior distribution of x, then we can take $p_x(x)$ as uniform over a region from L to U, where $L<l_{k,i}$ for all k and i and $U>u_{k,j}$ for all k and j (except for the last j for each k since $u_{k,j}$ is $\infty$ in this case). In this case we can write:

$$\mathbb{P}(x \geq d_i \mid y) = \frac{\int_{d_i}^{\infty} p_x(x) p_{y|x}(y \mid x)\,dx}{\int_{-\infty}^{\infty} p_x(x) p_{y|x}(y \mid x)\,dx} \tag{6}$$

$$= \frac{\int_{d_i}^{U} p_{y|x}(y \mid x)\,dx}{\int_{L}^{U} p_{y|x}(y \mid x)\,dx} \tag{7}$$

$$= \frac{\int_{d_i}^{U} \mathcal{N}_y(x, \sigma_n)\,dx}{\int_{L}^{U} \mathcal{N}_y(x, \sigma_n)\,dx} \tag{8}$$

$$= \frac{\int_{d_i}^{U} \mathcal{N}_x(y, \sigma_n)\,dx}{\int_{L}^{U} \mathcal{N}_x(y, \sigma_n)\,dx} \tag{9}$$

$$= \frac{F_{\mathcal{N}}(U; y, \sigma_n) - F_{\mathcal{N}}(d_i; y, \sigma_n)}{F_{\mathcal{N}}(U; y, \sigma_n) - F_{\mathcal{N}}(L; y, \sigma_n)} \tag{10}$$

where $F_{\mathcal{N}}(z;\mu,\sigma)$ is the cumulative normal distribution of mean $\mu$ and standard deviation $\sigma$, evaluated at z, which is equal to $$\frac{1}{2}\left[1 + \operatorname{erf}\left(\frac{z-\mu}{\sigma\sqrt{2}}\right)\right].$$

Since $F_{\mathcal{N}}(z;\mu,\sigma)=-F_{\mathcal{N}}(\mu;z,\sigma)$, we can equivalently write:

$$\mathbb{P}(x \geq d_i \mid y) = \frac{F_{\mathcal{N}}(y; d_i, \sigma_n) - F_{\mathcal{N}}(y; U, \sigma_n)}{F_{\mathcal{N}}(y; L, \sigma_n) - F_{\mathcal{N}}(y; U, \sigma_n)} \tag{11}$$

For sufficiently small values of L, where $F_{\mathcal{N}}(y;L,\sigma_n)\approx 1$ and sufficiently large values of U, where $F_{\mathcal{N}}(y;U,\sigma_n)\approx 0$, this simplifies to:

$$\mathbb{P}(x\geqq d_i|y)\approx F_{\mathcal{N}}(y;d_i,\sigma_n) \tag{12}$$

or, equivalently:

$$\mathbb{P}(x \geq d_i \mid y) \approx \frac{1}{2}\left[1 + \operatorname{erf}\left(\frac{y-d_i}{\sigma_n\sqrt{2}}\right)\right] \tag{13}$$

For each $d_i$, these functions are identically shaped functions positioned at $d_i$. So, with this approximation, for a given value of $\sigma_n$, functions of identical shape can be reused for each $d_i$ simply by repositioning the location of the function. Under this assumption, the series of soft slicers can be implemented using a single function that can be repositioned using an additive offset.

Figure 4:
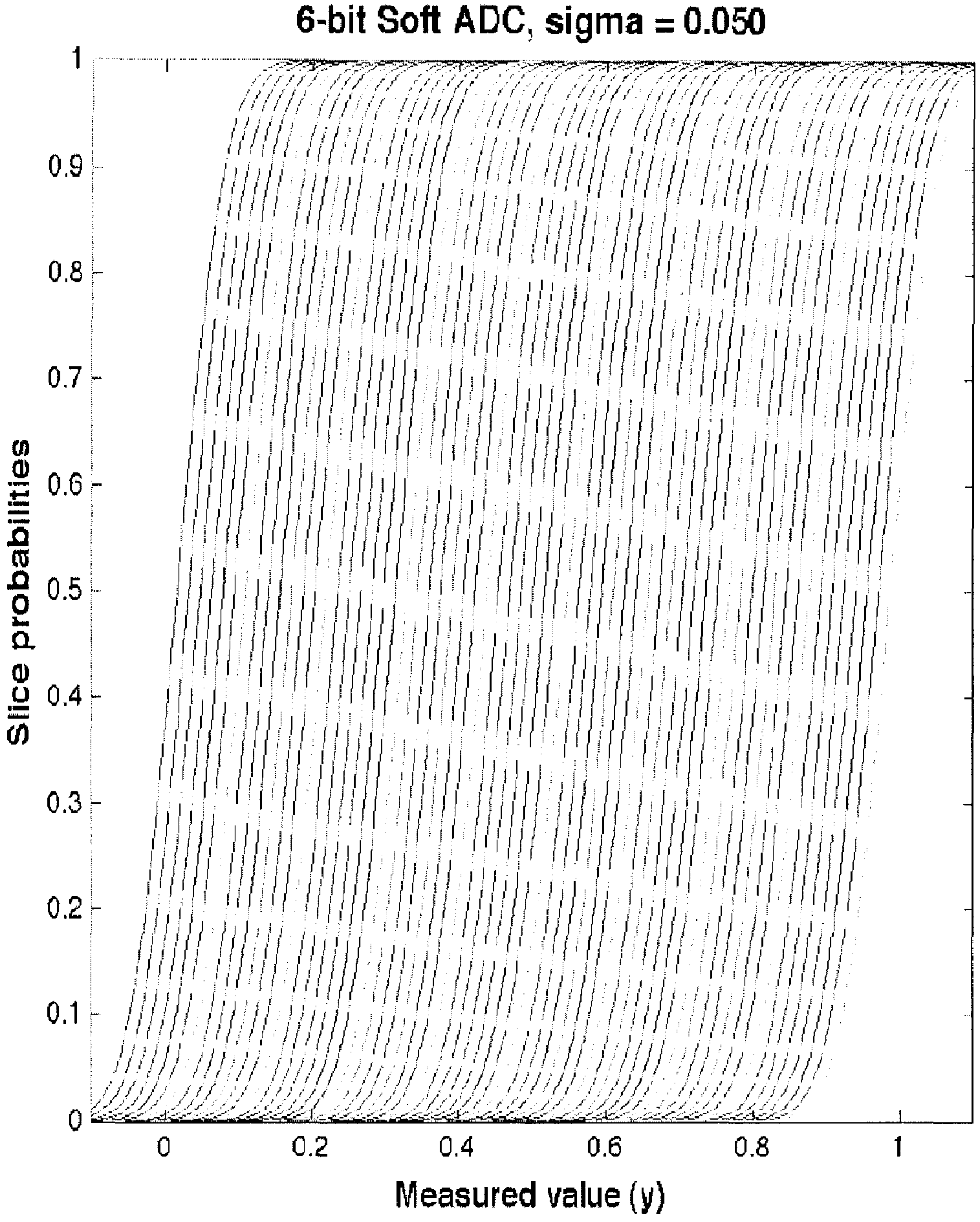
FIG. 4 is a plot of probability as a function of y for each soft slicer for a 6-bit soft ADC.
Figure 5:
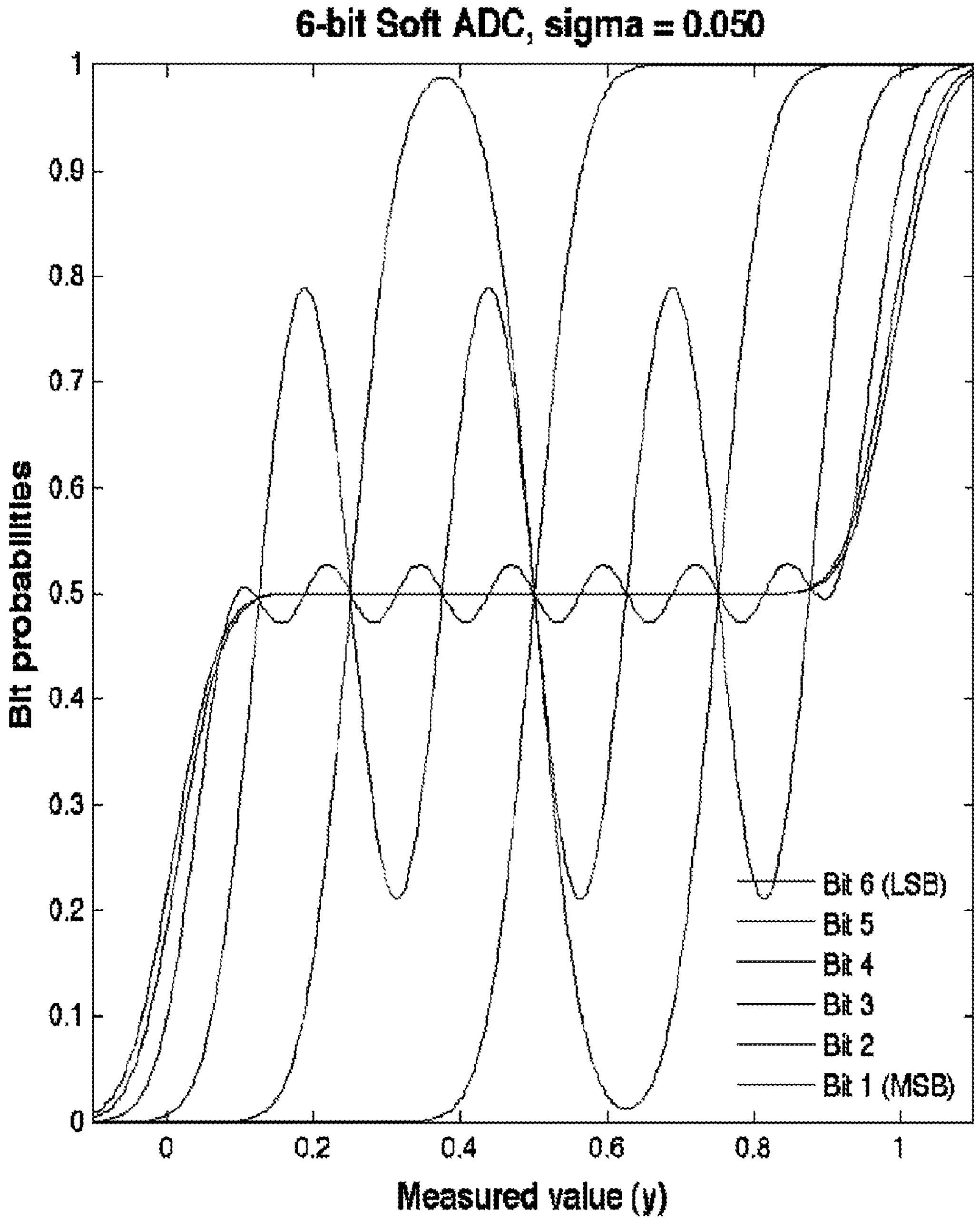
FIG. 5 is a plot of bit probabilities as a function of y for each bit of a 6-bit soft ADC.

As an example, FIG. 4 shows a series of curves, each representing probability as a function of y for a distinct soft slicer associated with boundary $d_i$ for a 6-bit ADC. In this case, we have assumed Gaussian noise, with $\sigma_n=0.05$, and an ADC spanning the range of real values from 0 to 1. We have assumed a uniform prior with L and U far beyond the span of the ADC. For the same example, FIG. 5 shows the corresponding set of bit-probabilities for each of the 6 bits, calculated according to Equation (5).

In the case that the prior of the signal x is Gaussian, $p_x(x)=\mathcal{N}_x(\mu_x,\sigma_x)$, then we can write:

$$\mathbb{P}(x \geq d_i \mid y) = \frac{\int_{d_i}^{\infty} p_x(x) p_{y|x}(y \mid x)\,dx}{\int_{-\infty}^{\infty} p_x(x) p_{y|x}(y \mid x)\,dx} \tag{14}$$

$$= \frac{\int_{d_i}^{\infty} \mathcal{N}_x(\mu_x, \sigma_x)\mathcal{N}_y(x, \sigma_n)\,dx}{\int_{-\infty}^{\infty} \mathcal{N}_x(\mu_x, \sigma_x)\mathcal{N}_y(x, \sigma_n)\,dx} \tag{15}$$

$$= \frac{\int_{d_i}^{\infty} \mathcal{N}_x(\mu_x, \sigma_x)\mathcal{N}_x(y, \sigma_n)\,dx}{\int_{-\infty}^{\infty} \mathcal{N}_x(\mu_x, \sigma_x)\mathcal{N}_x(y, \sigma_n)\,dx} \tag{16}$$

$$= \frac{\int_{d_i}^{\infty} \mathcal{N}_x(\hat{y}, \hat{\sigma}_n)\,dx}{\int_{-\infty}^{\infty} \mathcal{N}_x(\hat{y}, \hat{\sigma}_n)\,dx} \tag{17}$$

$$= -F_{\mathcal{N}}(d_i; \hat{y}, \hat{\sigma}_n) \tag{18}$$

$$= F_{\mathcal{N}}(\hat{y}; d_i, \hat{\sigma}_n) \tag{19}$$

where $$\hat{y} = \frac{yR_n + \mu_x R_x}{R_n + R_x}, \text{ with}$$

$$R_x = \frac{1}{\sigma_x^2} \text{ and}$$

$$R_n = \frac{1}{\sigma_n^2}, \text{ and where}$$

$$\frac{1}{\hat{\sigma}_n^2} = \hat{R}_n = R_n + R_x.$$

When $\sigma_x$ is large in comparison with $\sigma_n$, then $\hat{y}\approx y$ and $\hat{\sigma}_n\approx\sigma_n$ and therefore:

$$\mathbb{P}(x\geqq d_i|y)\approx F_{\mathcal{N}}(y;d_i,\sigma_n) \tag{20}$$

or, equivalently:

$$\mathbb{P}(x \geq d_i \mid y) \approx \frac{1}{2}\left[1 + \operatorname{erf}\left(\frac{y-d_i}{\sigma_n\sqrt{2}}\right)\right] \tag{21}$$

This approximation for a Gaussian prior is identical to the approximation for a uniform prior with sufficiently small values of L and sufficiently large values of U.

The configuration of the input comparison module 120 (see FIG. 1) is therefore based on the introduction above, with the signal characteristics 117 providing the known or estimate of variance(s) in the equations above.

For binary encoded output bits, the boundaries associated with each bit form a hierarchy that can be used to determine the order of computation. In this case, going from most-significant-bit (MSB) to least-significant-bit (LSB), the region boundaries associated with each successive bit share all of the boundaries with all previous (more significant) bits.

For an n-bit ADC, we number the bits from 1, the most significant bit, to n, the least significant bit, so that the numbers corresponds to levels of the hierarchy. To simplify notation, we normalize the input range of the ADC to span real values from 0.0 to 1.0.

The region $\mathcal{B}_1$ for the most significant bit, has a single lower boundary, $l_{1,1}=\frac{1}{2}$. For the next most significant bit, the region boundary $\mathcal{B}_2$, adds two additional boundaries for a total of three. Specifically, $\mathcal{B}_2$ has two lower boundaries, $l_{2,1}=\frac{1}{4}$ and $l_{2,2}=\frac{3}{4}$ plus one upper boundary, $u_{21}=\frac{1}{2}=l_{1,1}$. The upper boundary is in common with the boundary from the previous level.

Generalizing this sequence, at each level of the hierarchy, k, $2^{k-1}$ boundaries are added, which are all of the lower boundaries of $\mathcal{B}_k$. The set of lower boundaries are positioned as $$l_{k,i} = \frac{1}{2^k} + \frac{(i-1)}{2^{k-1}}$$

for i=1 to $i=2^{k-1}$. The $2^{k-1}-1$ boundaries already computed are all of the upper boundaries of $\mathcal{B}_k$.

For each level of the hierarchy, the probabilities associated with the upper boundaries have already been computed for previous levels. Therefore, only probabilities associated with the $2^{k-1}$ lower boundaries need be computed. For each of these boundaries, we compute $\mathbb{P}(x \geqq l_{k,i}|y)$ as described in previous sections.

From Equation (5) we can see that calculating the bit probabilities is simply taking the sum of the lower boundary probabilities minus the sum of the upper boundary probabilities. But since the upper boundary probabilities are simply the probabilities for all of the boundaries already computed for previous levels, and the lower boundary probabilities are the probabilities for all of the boundaries added for the current level, we can sum these groups of probabilities separately and subtract them to form the probability of bit k.

The sum of the probabilities of the previous levels can be kept as a running sum, $S_{k-1}$, where at each level we perform the following computations to generate both the bit probability and the running sum to be used at the next level:

$$P_k = \sum_i \mathbb{P}(x \geq l_{k,i} \mid y) \tag{22}$$

$$\mathbb{P}(x \in \mathcal{B}_k \mid y) = P_k - S_{k-1} \tag{23}$$

$$S_k = P_k + S_{k-1} \tag{24}$$

where $S_0=0$.

If computing the full hierarchy described above, probabilities associated with a total of $2^k-1$ boundaries would need to be computed. But under typical conditions, most of these probabilities will be very nearly 0 or 1.

Since $\mathbb{P}(x \geqq d_i|y)$ is a monotonically increasing function of y and a monotonically decreasing function of $d_i$, probability values previously computed in the hierarchy can be used as upper or lower bounds on the probability value for a given boundary. Specifically, if we have already computed $\mathbb{P}(x\ d_a|y)$ and $\mathbb{P}(x \geqq d_b|y)$ where $d_a<d_i<d_b$, then $\mathbb{P}(x \geqq d_a|y)$ is an upper bound on the value of $\mathbb{P}(x \geqq d_i|y)$ and $\mathbb{P}(x \geqq d_b|y)$ is a lower bound.

Thus, if $\mathbb{P}(x \geqq d_a|y)<\epsilon$ for a small positive value of $\epsilon$, then $\mathbb{P}(x \geqq d_i|y)<\epsilon$. For sufficiently small $\epsilon$ when this condition occurs, we can skip the computation of $\mathbb{P}(x \geqq d_i|y)$ entirely and assume any value from 0 to $\epsilon$. To simplify implementation, we can choose the value 0, which will be approximately correct.

Similarly, if $\mathbb{P}(x \geqq d_b|y)>1-\epsilon$ then $\mathbb{P}(x \geqq d_i|y)>1-\epsilon$, and we can skip the computation of $\mathbb{P}(x \geqq d_i|y)$ entirely and assume any value from $1-\epsilon$ to 1. To simplify implementation, we can choose the value 1, which will be approximately correct.

In choosing a and b for the above bounds, the tightest bounds are when $d_a$ is the largest already-computed boundary value less than $d_i$ and, similarly, when $d_b$ is the smallest already-computed boundary value greater than $d_i$. Note that for the smallest value of boundary being computed at a given level, there is no lower value that has already been computed, and thus no upper bound less than 1. Similarly, for the largest boundary value computed at a given level, there is no larger value that has already been computed, and thus no lower bound greater than 0.

Figure 6:
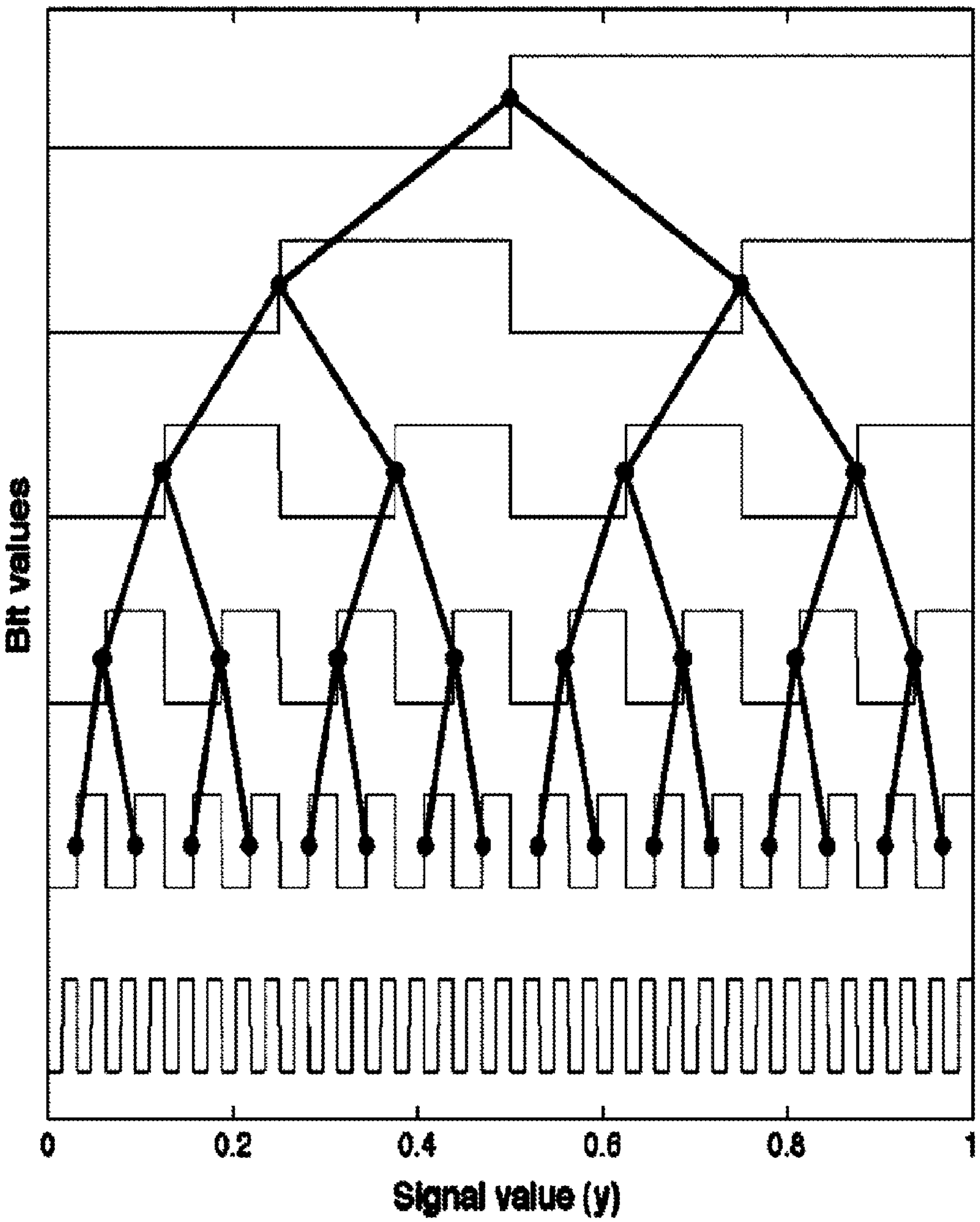
FIG. 6 is a tree diagram of boundary positions for each bit of a 6-bit ADC (last level not shown)

The dependencies represented by these choices for a and b can be represented as a binary tree. For each soft slicer at level k, the corresponding node in the tree connects to the two nodes associated with the soft slicers at level k+1 with the nearest soft slicer positions (one above and one below). FIG. 6 shows the tree of boundary positions that determine the soft slicer positions for a 6-bit ADC (the last level of the tree is not shown).

As we proceed through each level of the hierarchy, the results determine which branches need be computed in the next levels. For each soft slicer, there are three possible outcomes that affect the conditional computation: (1) the computed probability is less than $\epsilon$, (2) the computed probability is greater than $1-\epsilon$, or (3) the computed value falls somewhere between these values. Under condition (1), the entire right-hand branch of the tree below the current node (corresponding to larger values) need not be computed and the corresponding probabilities can be assumed equal to 0. Note that this applies not only to the next level, but to all subsequent levels in the same branch. Similarly, under condition (2), the entire left-hand branch of the tree below the current node (corresponding to smaller values) need not be computed and the corresponding probabilities can be assumed equal to 1. Under condition (3) both branches need to be continue to be computed.

In one implementation, the determination of the three conditions above are determined directly, by comparing the output of the soft slicer to thresholds $\epsilon$ and $1-\epsilon$. If $\epsilon$ is very small, these comparison operations must be fairly precise. In an alternative implementation, since for a given noise and signal distribution we know the shape and position of each soft slicer curve, the two values of y that correspond to the values for which the soft slicer output would cross $\epsilon$ and $1-\epsilon$, respectively, are pre-calculated. When each soft slicer is computed, we also compute two hard thresholds on the value of y, at each of the pre-computed values. Conditions (1)-(3), above, are determined based on the outcome of these hard thresholds. While these are hard thresholds (comparators), the values need not be very precise since a large change in these threshold values would produce only a small change in the outcome of the soft slicer (since the soft-slicer curves are nearly flat in the regions where its value is near 0 or 1.

Using the direct comparison of the soft slicer outputs to the thresholds, $\epsilon$ and $1-\epsilon$, the computation can be summarized according to pseudocode shown of FIG. 7. This description corresponds directly to the implementation shown in FIG. 3.

Using the alternative implementation described above, in which the y value is compared to pre-calculated thresholds in lieu of comparing the soft slicer outputs to $\epsilon$ and $1-\epsilon$, the conditional computation can be summarized according to pseudocode shown of FIG. 8. This description corresponds directly to the implementation shown in FIG. 5.

Equivalent variations of this algorithm would make use of commonly used data structures to perform operations on entire branches of the tree more simply.

Figure 9:
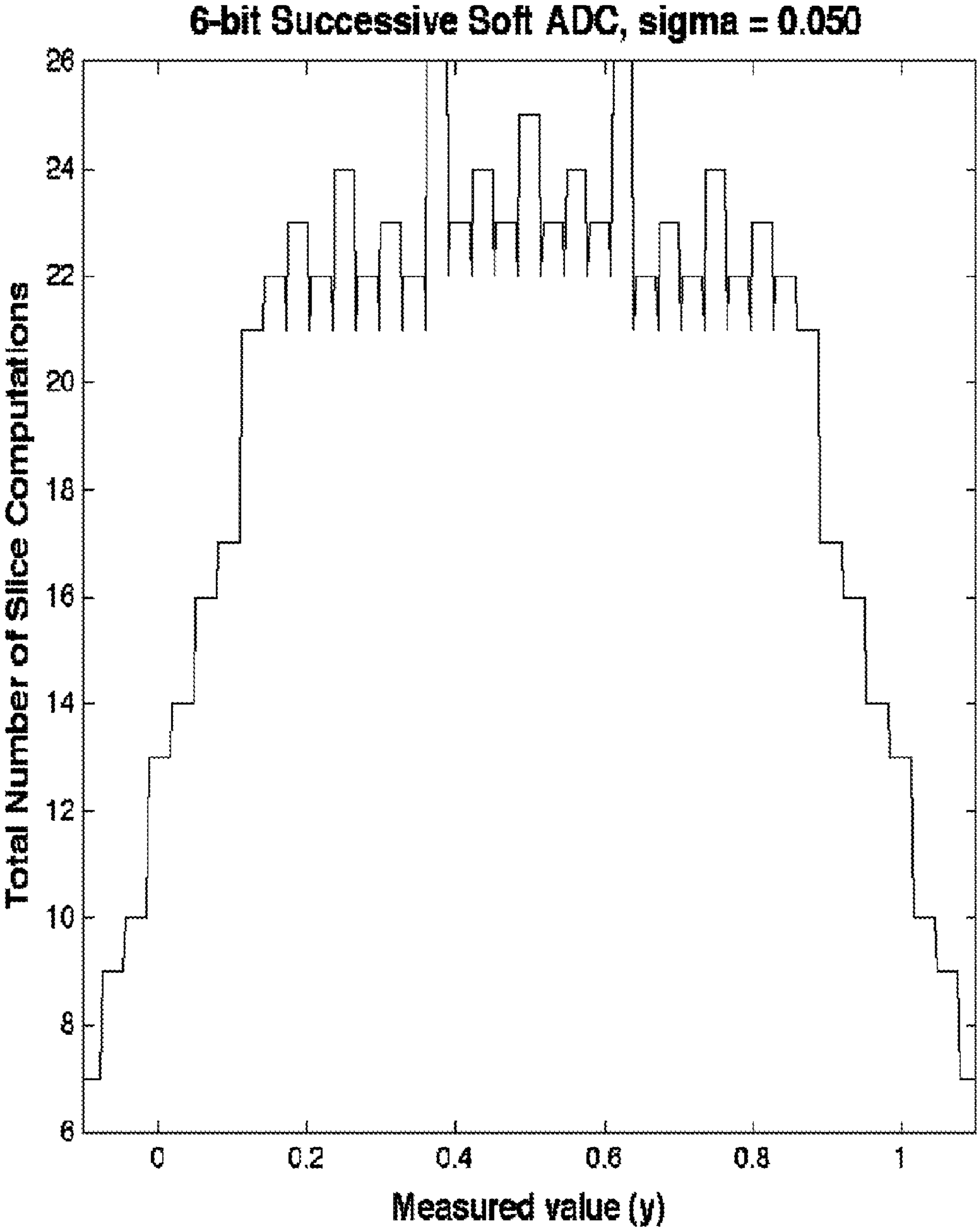
FIG. 9 is a plot of the number of soft slicer computations as a function of y for each soft slicer for a 6-bit successive soft ADC.

By skipping computation in the manner described in this section, the total number of soft slicer computations needed can be much less than $2^k-1$. The amount of computation needed depends primarily on the values of $\sigma_n$, $\epsilon$, and y. The specific form of the prior distribution also has an effect. FIG. 9 shows the number of slice computations needed as a function of y for the example described above for a 6-bit soft ADC. For this example, $\epsilon=0.0025$.

Figure 10:
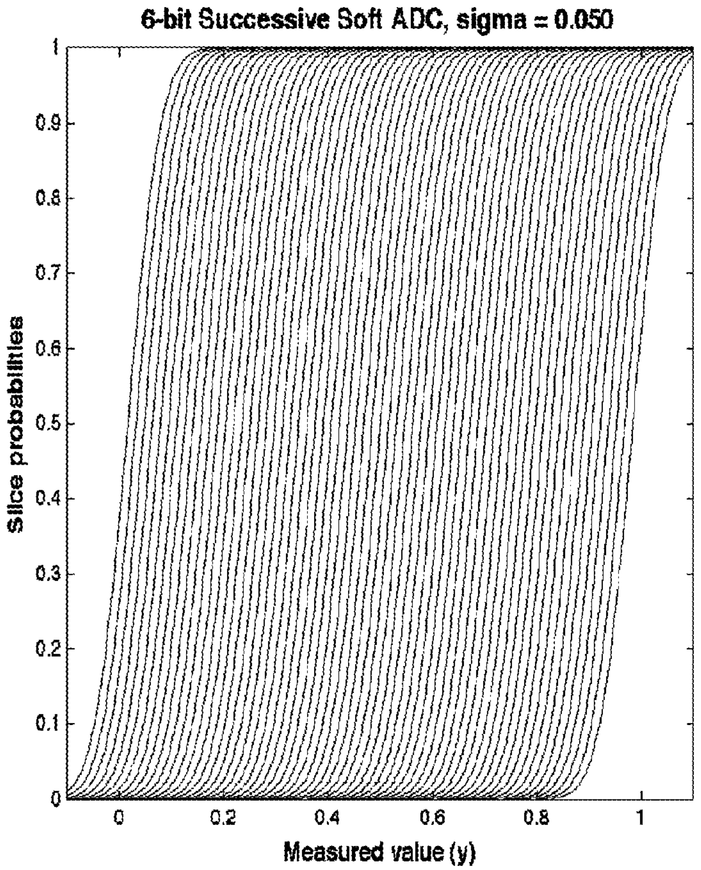
FIGS. 10 and 11 are plots of the slice and bit probabilities, respectively, for a 6-bit soft ADC.
Figure 11:
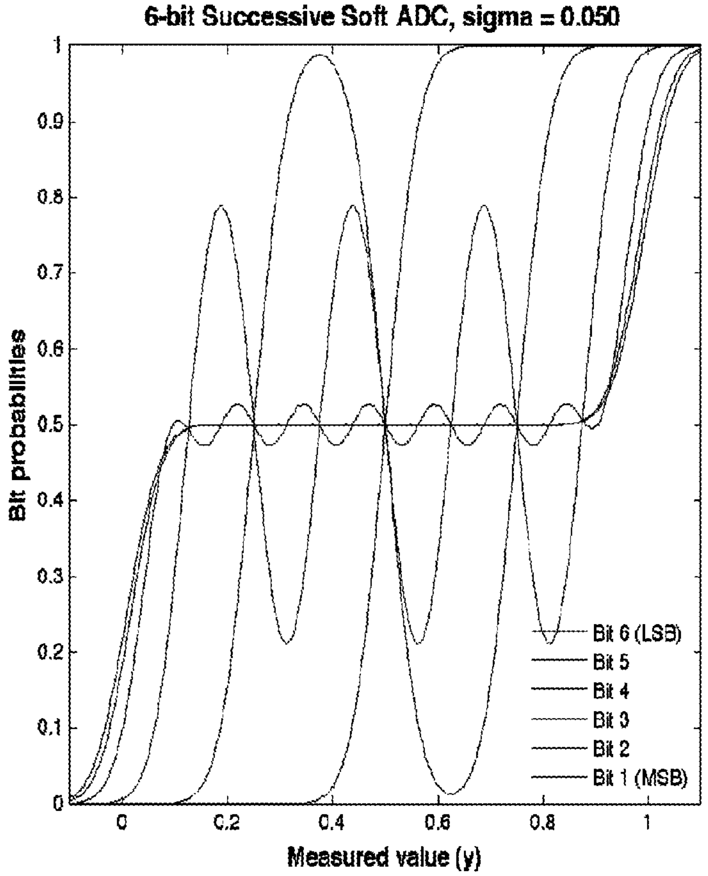

Continuing the earlier example, FIGS. 10 and 11 show the slice and bit probabilities, respectively, for a 6-bit soft ADC using successive computation as described in this section. These figures are nearly indistinguishable from the ideal figures, shown above.

From FIG. 11, we can see that as we progress from MSB to LSB the bit probabilities tend toward uncertainty—that is, probability ½. With binary encoding, less significant bits are generally not more certain than more significant bits for a given value of y. Thus, when we reach a value sufficiently close to ½, we can terminate the hierarchy and assume all remaining bits have probability ½. In doing so, we can avoid any further computation of the hierarchy, including soft slicers and bit calculations.

Specifically, as we process each level of the hierarchy, from k=1 to n, if $|\mathbb{P}(x \geqq \in \mathcal{B}_k|y)-½|<\delta$, for some small positive value of $\delta$, then set $\lfloor \mathbb{P}(x \in \mathcal{B}_m|y)=½$ for all m>k.

Note that the order of certainty with bit significance is not strictly true for all values of y, particularly for values near the ends of the ADC's range. When this assumption is not true and this rule is applied, there can be error in the probabilities assigned to the least significant bits greater than $\delta$.

Figure 12:
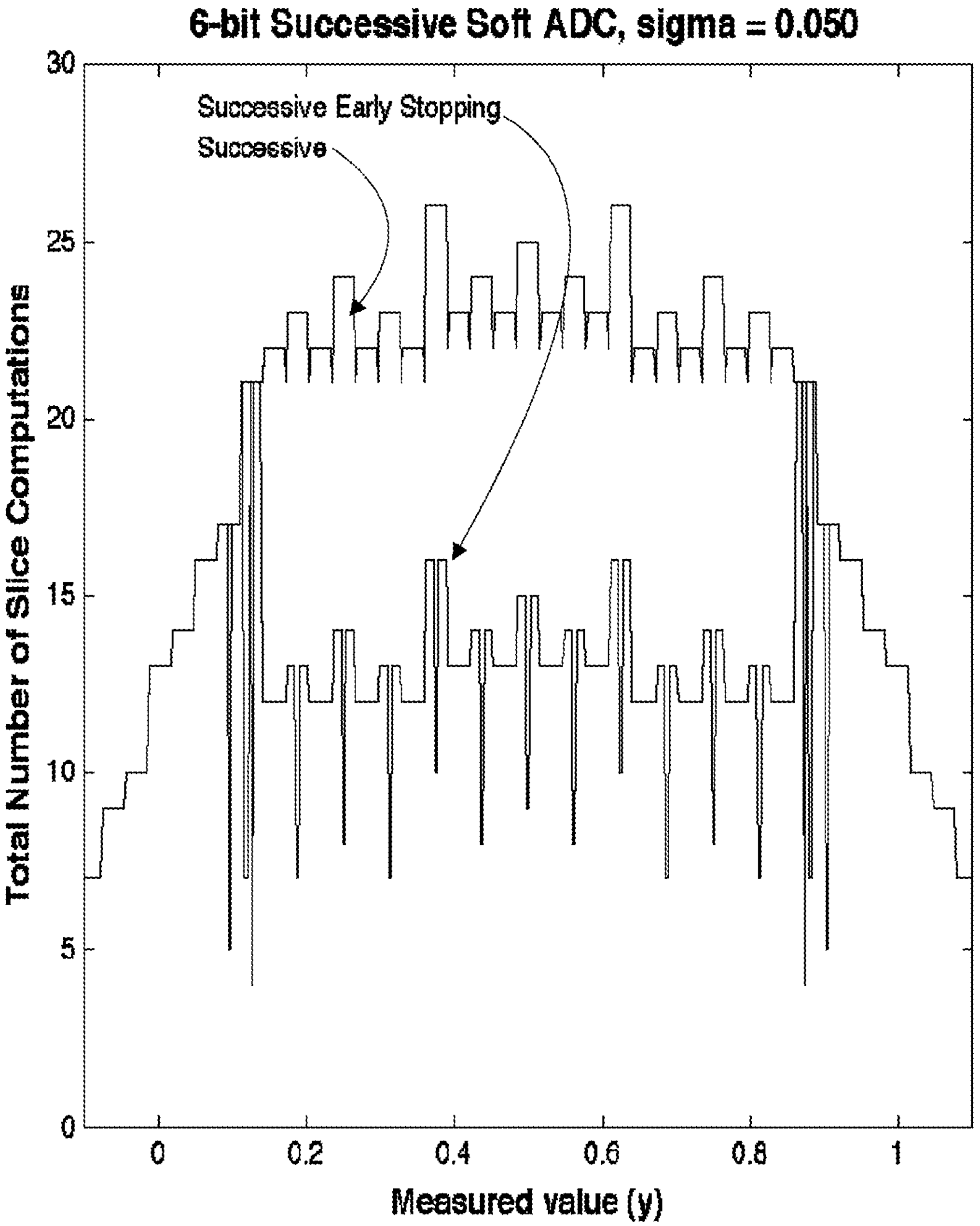
FIG. 12 is a plot of the number of soft slicer computations as a function of y for each soft slicer for a 6-bit successive soft ADC

FIG. 12 shows the number of slice computations needed as a function of y for the previously used example with and without early stopping. The red curve shows the number of slice computations with early stopping as described in this section, and the blue curve shows the number of computations required without early stopping. For this example, $\delta=0.0025$.

Figure 13:
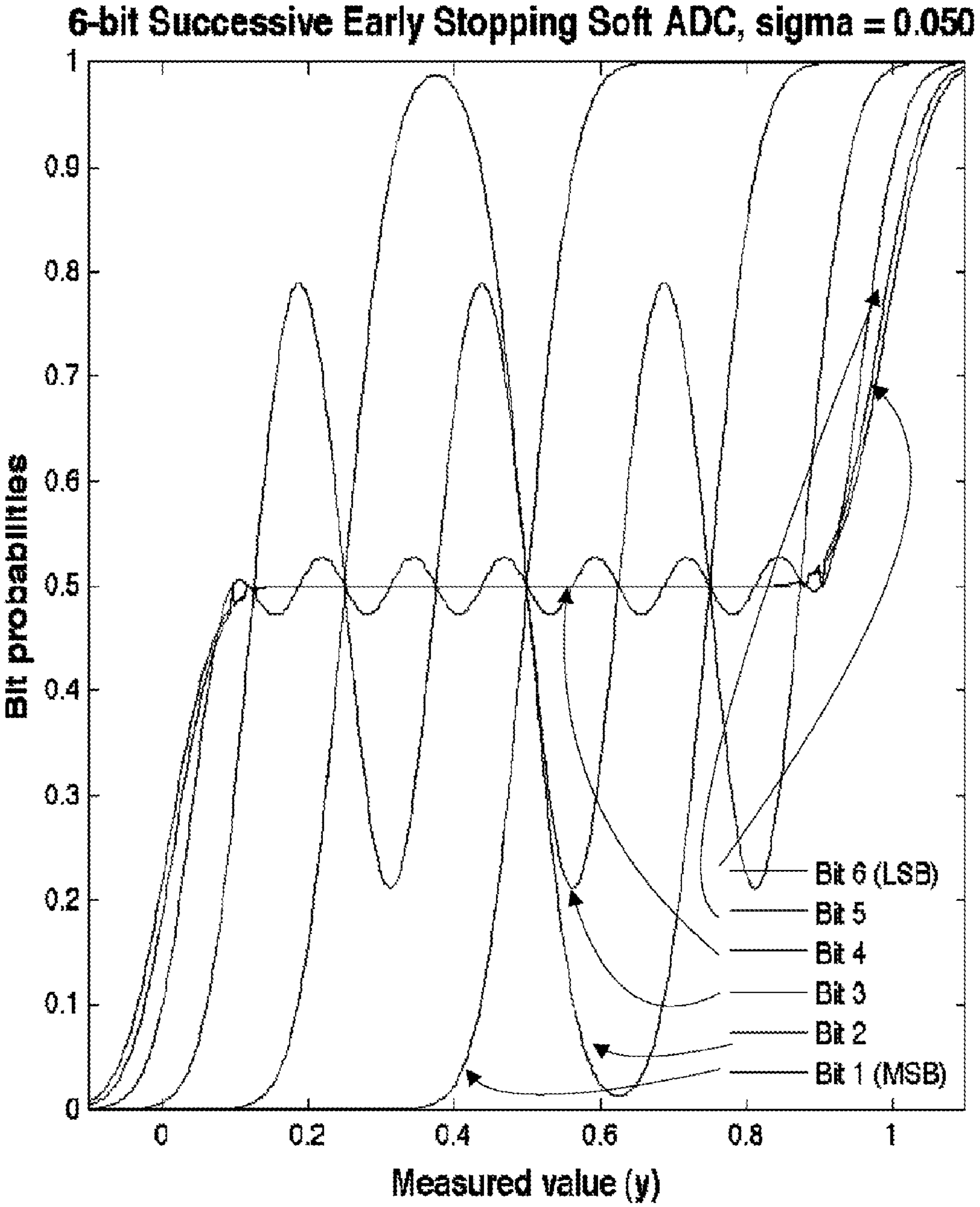
FIG. 13 is a plot of bit probabilities as a function of y for each bit of a 6-bit successive soft ADC with early stopping.

Continuing the earlier example, FIG. 13 shows the bit probabilities, respectively, for a 6-bit soft ADC using successive computation with early termination as described in this section, with $\delta=0.0025$. As mentioned above, a small amount of degradation versus the earlier cases can be seen near the lower and upper ends of the input range in the transition region where the values begin to diverge from the probability ½ range.

Including early stopping, the computation can be summarized in the pseudocode shown in FIG. 14. This description corresponds directly to the implementation shown in FIG. 4.

Figure 15:
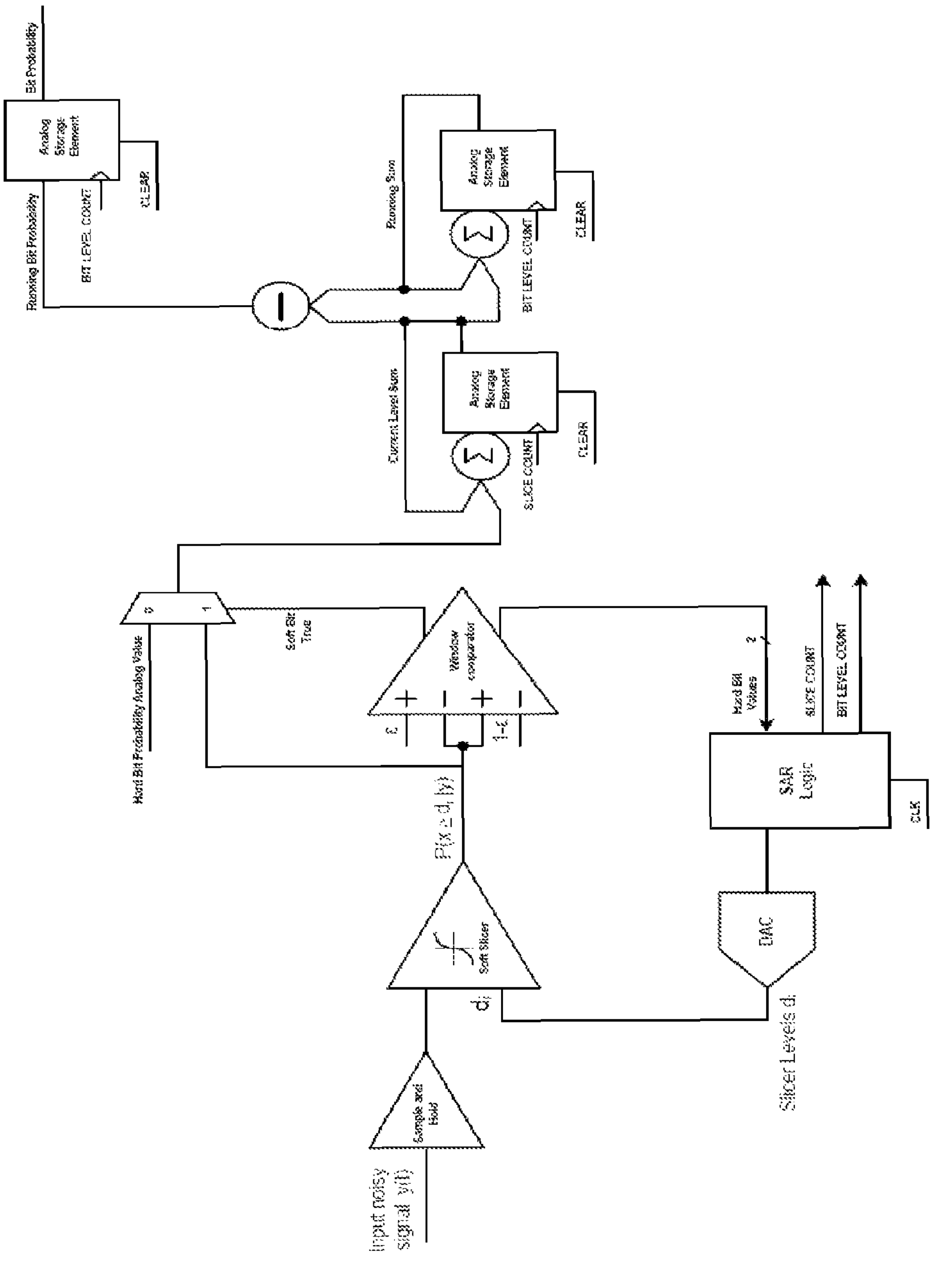
FIGS. 15-17 show implementations of signal converter.

FIG. 15 shows one implementation of the signal converter in which a sample and hold circuit receives a noisy signal and provides it to a soft slicer. As in all other figures, FIG. 15 shows generic analog storage elements. A "slice count" is a slicer count for a particular bit level. A "bit level count" tracks which bit is being processed at any instant.

The window comparator produces a "soft bit true," which is high when the slicer output is within one of the two windows. The window comparator also outputs hard bit values. The "hard bit probability analog value" is an analog signal equivalent to the hard bit value of 0 or 1. Since the slicer output can represent a current or voltage value, this provides a way to represent hard digital values in the analog domain.

Figure 16:
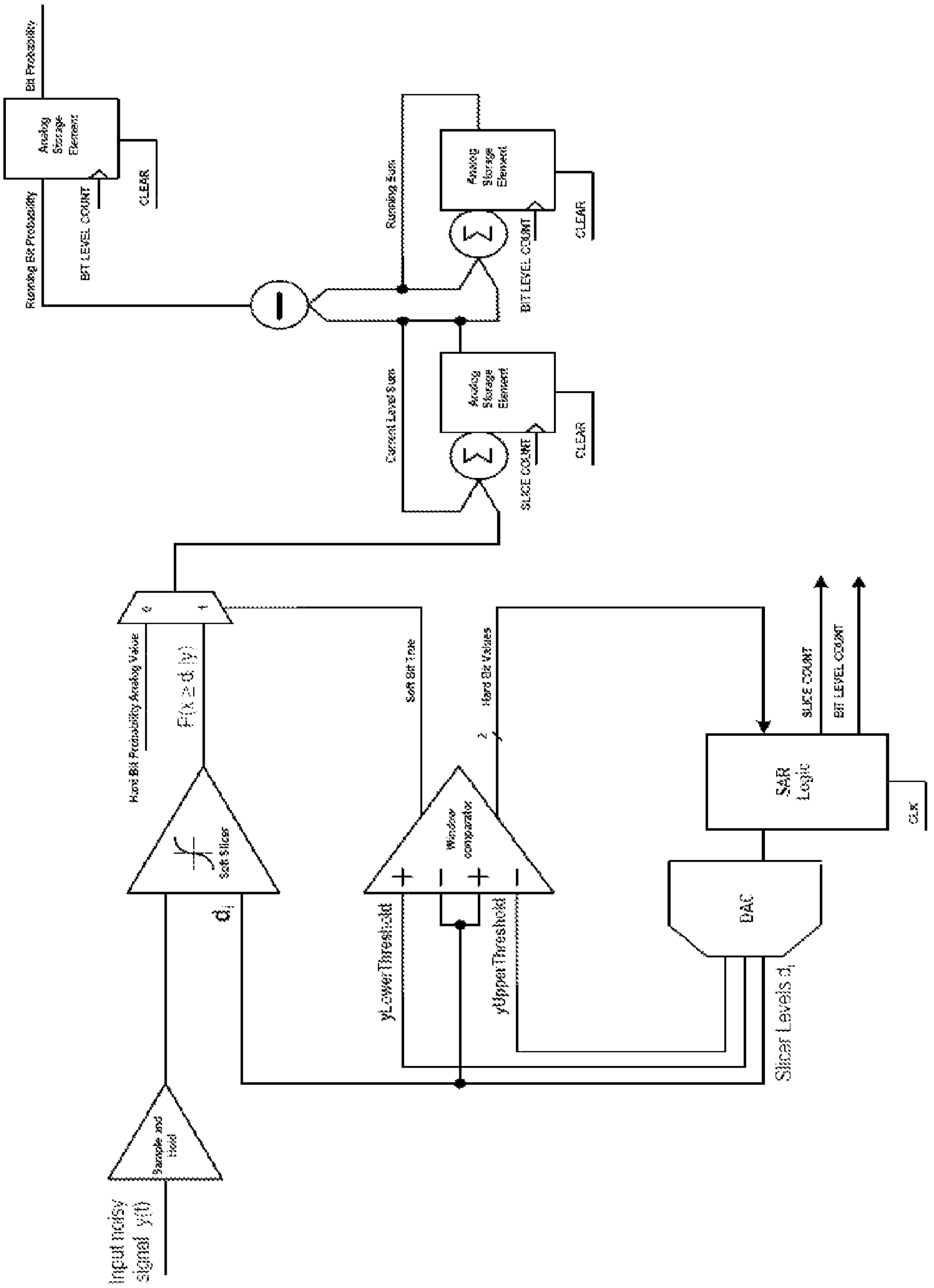

The implementation of FIG. 16 uses the fact that if, as a result of noise in the input signal, all possible values of a bit are equally likely, then that bit, and any less significant bits, effectively contains no information. As a result, there is no point in continuing to calculate probabilities for that bit and any less significant bits.

The additional signal "TERMINATE" in FIG. 2 is used to terminate execution of an algorithm once the bit probabilities for a given bit level fall so close to 0.5 that, as a practical matter, that bit and all less significant bits contain no information. When the "TERMINATE" signal is enabled for a bit, the probability that the bit is in a first state is within a predetermined accuracy window of 0.5. In that case, for all less significant bits, the probability that that bit is in a first state is set to 0.5.

FIG. 16 shows yet another embodiment in which the signals "yUpperThreshold" and "yLowerThreshold," which are provided to the window comparator, are precomputed hard threshold values that depend on slicer level and noise.

The input signal, in the absence of noise, that is introduced into the circuitry need not arise from a uniform distribution, but can arise from other probability distributions, or from sets of permitted values, for example, form a constellation of signaling values. Furthermore, the input may have multiple dimensions, and the comparison modules forming comparisons for multidimensional regions.

In some alternatives or extensions, the decision tree we use in our example is what is can be thought of as a generative model for the distribution of the signal. We use a binary tree with un-weighted decisions between choosing a 0 branch or a 1 branch. This process produces a uniform distribution, which is not a bad way to start—it assumes no special structure in the signal.

However, it is very possible to extend this generative model to take into account greater structure in the system that generated the signal. Let us call this system the "transmitter." It could be a human engineered system such as a wireless transmitter that favors sending certain waveforms or signals over others, or could be a naturally occurring phenomena such as the sound from a tree blowing banging against the exterior of a house, or any other system that generates a signal we wish to analyze.

A slightly more specific model could still be a binary tree with weights for the decisions. These (weighted) binary decisions are called Bernoulli variables. Perhaps we know that the signal tends to be low amplitude, so the MSB is 60% likely to be a 0. This prior could be incorporated into the decision process as we branch on the tree, proceeding through the conversion process.

Such weights need not be determined by a human a priori and input into the system. They can be learned. One principled way to do this is to represent the decision variables with Beta distributions, the conjugate distribution of the Bernoulli distribution. We could then estimate the parameters of these beta distributions using training data obtained from recording multiple samples of the signal over time (or space or the like). An estimation algorithm such as Markov Chain Monte Carlo, Gibbs sampling or a variational technique can be used to perform the estimation of these parameters from the data. Different values of these parameters would produce a family of distributions that could be used to model the data. We could also potentially use this process to model the noise in the channel in addition or instead of only modeling the signal.

So far we have retained the binary tree model and only varied the weights of the decisions. But if we do not like the limited family of distributions made available by simply weighting the binary tree process, then we can generalize further. We can actually change the form of the tree. For example, we could use what we herein call the "Boston Science Museum Process." This is derived from the exhibit in many science exploratorium museums that involves dropping ping pong balls through a diagonal lattice of pegs attached to a peg board. The result is a pile of balls with a Gaussian distribution. This is similar to a binary process, but as illustrated below, the initial decisions do not move your position as far on the number line, which clumps together the final result into a Gaussian distribution. This process is an efficient way to model a Gaussian distribution. Furthermore, just as we did in the binary tree process, we could weight the variables in the Boston Science Museum with priors and/or parametrize the variables as Beta distributions and learn their weights. We could also potentially use this process to model the noise in the channel in addition or instead of only modeling the signal.

Even further generalizing, we could design or learn an infinite number of more complex parametric or non-parametric generative models or factor graphs to model the "transmitter" system.

The computation described above (either with or without early stopping) can be implemented in hardware to directly convert analog input signals to analog probability values.

In one embodiment, the input signal is sampled via a sample-and-hold circuit. The output of the sample-and-hold is used successively as input to the soft-slicer, each time using a distinct soft-slicer position (the additive offset of the soft-slicer based on which boundary, $d_i$ is being computed) based on the procedure described above to determine the next soft-slicer position. Each output of the soft-slicer is accumulated as described above to form the bit probabilities.

In another embodiment, not only the position of the soft-slicer is varied on each use, but the shape of the slicer function. This would be appropriate when the approximations that allow a common slicer function are not appropriate. In this case, the slicer circuit is parameterized by both the position (as an additive offset) as well as other parameters that allow it's shape to change appropriately. Depending on the specific slice, $d_i$, being computed, the control circuitry would set the parameters to approximate the ideal shape of that slicer function.

In another embodiment, the computation is pipelined, such that as each bit layer is computed, the input value (from the sample-and-hold) and the intermediate results are passed to a subsequent stage to operate on the next bit level. While the next stage operates on the next bit level associated with one input value, the current stage receives the input (and intermediate results, in the case of stages beyond the first stage) associated with the next input value. In this way, the time between inputs can be significantly shorter than the time to perform the entire APC computation for a given input value.

Figure 17:
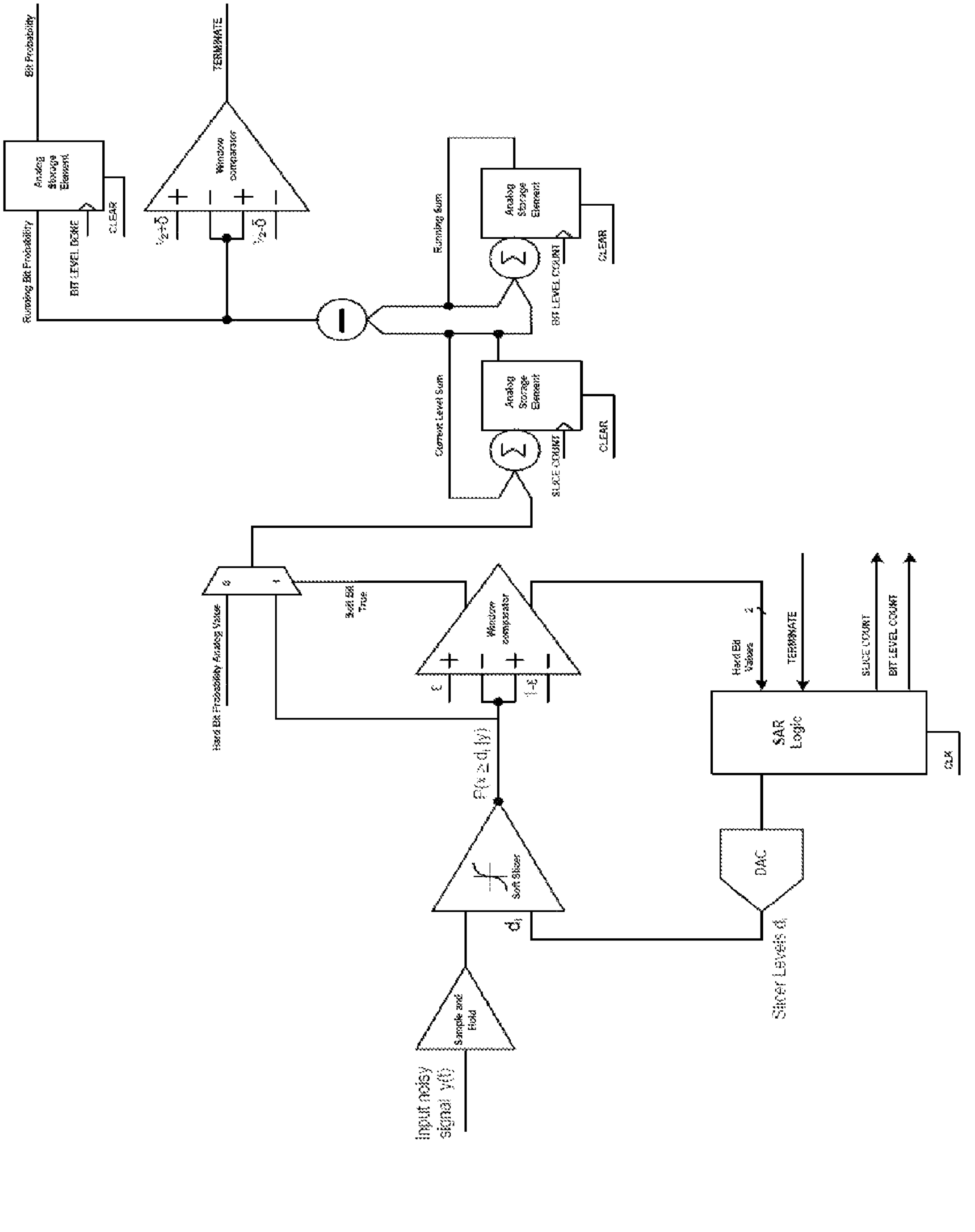

FIGS. 15-17 show a number of implementations of parts of the systems described above. FIG. 15 shows one implementation of an analog-to-probability converter in which a sample and hold circuit receives a noisy signal and provides it to a soft slicer. As in all other figures, FIG. 15 shows generic analog storage elements. A "slice count" is a slicer count for a particular bit level. A "bit level count" tracks which bit is being processed at any instant.

The window comparator produces a "soft bit true," which is high when the slicer output is within one of the two windows. The window comparator also outputs hard bit values. The "hard bit probability analog value" is an analog signal equivalent to the hard bit value of 0 or 1. Since the slicer output can represent a current or voltage value, this provides a way to represent hard digital values in the analog domain.

The implementation of FIG. 16 uses the fact that if, as a result of noise in the input signal, all possible values of a bit are equally likely, then that bit, and any less significant bits, effectively contains no information. As a result, there is no point in continuing to calculate probabilities for that bit and any less significant bits.

The additional signal "TERMINATE" in FIG. 16 is used to terminate execution of an algorithm once the bit probabilities for a given bit level fall so close to 0.5 that, as a practical matter, that bit and all less significant bits contain no information. When the "TERMINATE" signal is enabled for a bit, the probability that the bit is in a first state is within a predetermined accuracy window of 0.5. In that case, for all less significant bits, the probability that that bit is in a first state is set to 0.5.

FIG. 17 shows yet another embodiment in which the signals "yUpperThreshold" and "yLowerThreshold," which are provided to the window comparator, are precomputed hard threshold values that depend on slicer level and noise.

It is to be understood that the foregoing description is intended to illustrate and not to limit the scope of the invention, which is defined by the scope of the appended claims. Other embodiments are within the scope of the following claims.

What is claimed is:

1. A signal converter comprising:

an input comparison module configured to accept an analog signal input, and to provide an analog comparison output characterizing a continuous value and a logical comparison output;

a controller coupled to the input comparison module configured to accept the logical comparison output from the input comparison module, and to control configuration of the input comparison module according to the logical comparison output; and an analog accumulator for accumulating the analog comparison output from the input comparison module, and providing a plurality of analog values, each analog value being associated with a different domain of the input of the input comparison module.

2. The converter of claim 1 wherein the analog accumulator includes a plurality of storage elements, each storage element being associated with a different one of the analog values provided.

3. The converter of claim 1 wherein the controller is configured to control an iterative conversion of the analog signal input, wherein at each iteration, the analog accumulator is updated with an analog comparison output.

4. The converter of claim 1 wherein the controller is configured to control a data dependent conversion, including terminating the conversion after a number of iterations that depends on the analog signal input.

5. The converter of claim 1 comprising a plurality of pipeline stages, wherein each of the stages includes an analog accumulator, an input comparator, and an analog input memory element, the analog accumulators being coupled to pass analog values between stages of the pipeline.

6. The converter of claim 5 wherein the controller is configured to control a pipelined conversion of a series of analog signal inputs, including configuring an input comparison at each stage according to a logic output of an input comparison at a prior stage.

7. The converter of claim 1 further comprising a computing device coupled the analog accumulator and configured to perform a probabilistic computation using the analog values provided from the accumulator.

8. A method for converting a noisy analog signal, which corresponds to a first signal having a range that consists of a plurality of range parts, into a plurality of analog values, each of which characterizes a probability that the first signal has a value that is within a particular one of said range parts, said method comprising:

receiving a noisy signal that includes a transmitted signal in combination with noise;

executing a procedure that includes, for each of a plurality of bits:

identifying a set of values that correspond to a first state of said bit;

determining a probability that said noisy signal, in the absence of noise, would have had a value within said set of values;

comparing said probability with a probability threshold; and for at most one of said plurality of bits, based on at least said comparison, terminating said procedure.

9. The method of claim 8, wherein for at least one of said bits, said set of values comprises a plurality of non overlapping subsets, each of which has a lower boundary and an upper boundary, and wherein determining said probability comprises for each of said lower boundaries, determining a first probability, said first probability being a probability that said noisy signal, in the absence of said noise, would have had a value in excess of said lower boundary, for each of said upper boundaries, determining a second probability, said second probability being a probability that said noisy signal, in the absence of said noise, would have had a value in excess of said upper boundary, and determining a difference between a sum of each of said first probabilities and a sum of each of said second probabilities.

10. A manufacture comprising a computer-readable medium, said medium including instructions for causing a computer to execute all the steps of the method of claim 8.

11. An apparatus comprising an analog-to-probability converter, said analog to digital converter including circuitry configured to implement all the steps of the method of claim 8.

12. A method for converting a noisy analog signal, which corresponds to a first signal having a range that consists of a plurality of range parts, into a plurality of analog values, each of which characterizes a probability that the first signal has a value that is within a particular one of said range parts, said method comprising:

receiving a noisy signal that includes a transmitted signal in combination with noise;

identifying a set of values that correspond to a state of a bit for a plurality of bits;

identify non-overlapping subsets of said set of values, each of said non-overlapping subsets having a boundary;

for one of said boundaries, determining a probability that a noisy signal, in the absence of noise, would have had a value in excess of said boundary;

determining that said value is at least a threshold distance from a value indicative of certainty;

on the basis of the boundary, selecting a set of additional boundaries;

for each of said boundaries in said selected set, setting said boundary to a value that indicates certainty.

* * * * *